United States Patent
Telfer

(10) Patent No.: US 11,616,162 B2
(45) Date of Patent: Mar. 28, 2023

(54) ENERGY HARVESTING ELECTRO-OPTIC DISPLAYS

(71) Applicant: E INK CORPORATION, Billerica, MA (US)

(72) Inventor: Stephen J. Telfer, Arlington, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 17/668,588

(22) Filed: Feb. 10, 2022

(65) Prior Publication Data

US 2022/0271188 A1 Aug. 25, 2022

Related U.S. Application Data

(62) Division of application No. 16/815,269, filed on Mar. 11, 2020, now Pat. No. 11,456,397.

(60) Provisional application No. 62/817,248, filed on Mar. 12, 2019.

(51) Int. Cl.
*H01L 31/12* (2006.01)
*H01L 27/32* (2006.01)
*H01L 31/054* (2014.01)

(52) U.S. Cl.
CPC ........ *H01L 31/125* (2013.01); *H01L 27/3227* (2013.01); *H01L 31/0543* (2014.12)

(58) Field of Classification Search
CPC .......................... H01L 31/125; H01L 31/0543
See application file for complete search history.

(56) References Cited

U.S. PATENT DOCUMENTS

| | | |
|---|---|---|
| 4,418,346 A | 11/1983 | Batchelder |
| 5,760,761 A | 6/1998 | Sheridon |
| 5,777,782 A | 7/1998 | Sheridon |
| 5,808,783 A | 9/1998 | Crowley |
| 5,872,552 A | 2/1999 | Gordon, II et al. |
| 6,054,071 A | 4/2000 | Mikkelsen, Jr. |
| 6,055,091 A | 4/2000 | Sheridon et al. |
| 6,097,531 A | 8/2000 | Sheridon |
| 6,130,774 A | 10/2000 | Albert et al. |
| 6,137,467 A | 10/2000 | Sheridon et al. |
| 6,144,361 A | 11/2000 | Gordon, II et al. |
| 6,172,798 B1 | 1/2001 | Albert et al. |
| 6,184,856 B1 | 2/2001 | Gordon, II et al. |
| 6,225,971 B1 | 5/2001 | Gordon, II et al. |
| 6,241,921 B1 | 6/2001 | Jacobson et al. |
| 6,271,823 B1 | 8/2001 | Gordon, II et al. |
| 6,301,038 B1 | 10/2001 | Fitzmaurice et al. |

(Continued)

FOREIGN PATENT DOCUMENTS

CN 102540565 A 7/2012

OTHER PUBLICATIONS

Wood, D., "An Electrochromic Renaissance?" Information Display, 18(3), 24 (Mar. 2002).

(Continued)

*Primary Examiner* — Tae-Sik Kang
(74) *Attorney, Agent, or Firm* — Rajesh Vallabh; Ioannis Constantinides

(57) ABSTRACT

An energy harvesting electro-optic display is disclosed comprising a photovoltaic cell that converts part of the incident light to electric current or voltage, wherein the electric current or voltage is used for the operation of the electro-optic display upon the conversion or stored in a storage component to be used for the operation of the display.

14 Claims, 12 Drawing Sheets

(56) References Cited

U.S. PATENT DOCUMENTS

| | | |
|---|---|---|
| 6,392,786 B1 | 5/2002 | Albert |
| 6,829,078 B2 | 12/2004 | Liang et al. |
| 6,870,657 B1 | 3/2005 | Fitzmaurice et al. |
| 6,922,276 B2 | 7/2005 | Zhang et al. |
| 6,950,220 B2 | 9/2005 | Abramson et al. |
| 6,982,178 B2 | 1/2006 | LeCain et al. |
| 7,002,728 B2 | 2/2006 | Pullen et al. |
| 7,012,600 B2 | 3/2006 | Zehner et al. |
| 7,072,095 B2 | 7/2006 | Liang et al. |
| 7,075,502 B1 | 7/2006 | Drzaic et al. |
| 7,116,318 B2 | 10/2006 | Amundson et al. |
| 7,144,942 B2 | 12/2006 | Zang et al. |
| 7,312,784 B2 | 12/2007 | Baucom et al. |
| 7,327,511 B2 | 2/2008 | Whitesides et al. |
| 7,411,719 B2 | 8/2008 | Paolini, Jr. et al. |
| 7,420,549 B2 | 9/2008 | Jacobson et al. |
| 7,453,445 B2 | 11/2008 | Amundson |
| 7,476,278 B2 | 1/2009 | Brabec et al. |
| 7,535,624 B2 | 5/2009 | Amundson et al. |
| 7,679,814 B2 | 3/2010 | Paolini, Jr. et al. |
| 7,715,088 B2 | 5/2010 | Liang et al. |
| 7,787,169 B2 | 8/2010 | Abramson et al. |
| 7,830,038 B2 | 11/2010 | Wang |
| 7,839,564 B2 | 11/2010 | Whitesides et al. |
| 7,933,061 B2 | 4/2011 | Kim et al. |
| 7,986,451 B2 | 7/2011 | Galley et al. |
| 8,009,348 B2 | 8/2011 | Zehner et al. |
| 8,040,592 B2 | 10/2011 | Fontana et al. |
| 8,120,838 B2 | 2/2012 | Lin et al. |
| 8,174,772 B1 | 5/2012 | DeVaul |
| 8,436,968 B2 | 5/2013 | Lin et al. |
| 8,576,476 B2 | 11/2013 | Telfer et al. |
| 8,710,359 B2 | 4/2014 | Wu et al. |
| 8,717,664 B2 | 5/2014 | Wang et al. |
| 8,803,157 B2 | 8/2014 | Hsu et al. |
| 9,170,468 B2 | 10/2015 | Lin et al. |
| 9,279,906 B2 | 3/2016 | Kang |
| 9,777,201 B2 | 10/2017 | Widger et al. |
| 9,837,852 B1 | 12/2017 | Barnes et al. |
| 9,921,451 B2 | 3/2018 | Telfer et al. |
| 9,928,810 B2 | 3/2018 | Harrington |
| 10,078,977 B2 | 9/2018 | Atkinson et al. |
| 10,444,553 B2 | 10/2019 | Laxton |
| 10,824,025 B2 | 11/2020 | O'Keeffe |
| 10,983,410 B2 | 4/2021 | Widger et al. |
| 2009/0056791 A1* | 3/2009 | Pfenninger ............ H01L 31/055 136/247 |
| 2009/0126792 A1 | 5/2009 | Gruhlke et al. |
| 2011/0010911 A1 | 1/2011 | Baldo et al. |
| 2011/0286076 A1* | 11/2011 | Lin .................... G02F 1/16761 359/296 |
| 2012/0194896 A1 | 8/2012 | Kothari et al. |
| 2014/0000704 A1 | 1/2014 | Farahi |
| 2014/0162729 A1 | 6/2014 | Garden et al. |
| 2014/0293188 A1 | 10/2014 | Chen et al. |
| 2015/0005720 A1 | 1/2015 | Zang et al. |
| 2015/0255651 A1 | 9/2015 | Barr et al. |
| 2015/0369433 A1 | 12/2015 | Chen et al. |
| 2016/0012710 A1 | 1/2016 | Lu et al. |
| 2016/0087116 A1 | 3/2016 | Chen et al. |
| 2017/0052753 A1 | 2/2017 | Paolini, Jr. et al. |
| 2017/0097555 A1 | 4/2017 | Lattes et al. |
| 2018/0031884 A1 | 2/2018 | Liu et al. |
| 2018/0138344 A1 | 5/2018 | Barr et al. |

OTHER PUBLICATIONS

O'Regan, B. et al., "A Low Cost, High-efficiency Solar Cell Based on Dye-sensitized colloidal TiO2 Films", Nature, vol. 353, pp. 737-740 (Oct. 24, 1991).

Bach, Udo. et al., "Nanomaterials-Based Electrochromics for Paper-Quality Displays", Adv. Mater, vol. 14, No. 11, pp. 845-848, (Jun. 5, 2002).

Hayes, R.A. et al., "Video-Speed Electronic Paper Based on Electrowetting", Nature, vol. 425, No. 25, pp. 383-385 (Sep. 2003).

Yeh, Chia-Hung et al., "Transparent Solar Concentrator for Flat Panel Display", Jpn. J. Appl. Phys., vol. 51, No. 6S, 06FL03 (2012).

Yang, C. et al., "Limits of Visibly Transparent Luminescent Solar Concentrators", Advanced Optical Materials, 5(8), p. 1600851 (2017).

Zhu, Rui et al., "Polarizing Organic Photovoltaics", Adv. Mater., vol. 23, pp. 4193-4198 (Aug. 9, 2011).

Menendez-Velazquez, Amador et al., "Light-recycling within electronic displays using deep red and near infrared photoluminescent polarizers", Energy Environ. Sci., vol. 6, p. 72 (2012).

* cited by examiner

ENERGY HARVESTING ELECTRO-OPTIC DISPLAYS

RELATED APPLICATIONS

This application is a divisional of copending U.S. patent application Ser. No. 16/815,269 filed on Mar. 11, 2020 (Publication No. US20200295222A1), which claims priority to U.S. Provisional Application No. 62/817,248 filed on Mar. 12, 2019, which is incorporated herein by reference in its entirety.

FIELD OF THE INVENTION

This invention relates to electro-optic displays. More specifically, this invention relates to an energy harvesting electro-optic display, that is, a display that can gather energy for functioning by converting light energy into electrical energy.

BACKGROUND OF THE INVENTION

The term "electro-optic", as applied to a material, a display or a device, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move by an application of an electric field. Electrophoretic displays can have attributes of good brightness and contrast, wide viewing angles, state bistability, and low power consumption when compared with liquid crystal displays.

Encapsulated electrophoretic media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. In a microcell electrophoretic display, the charged particles and the fluid are not encapsulated within capsules but instead are retained within a plurality of cavities formed within a carrier medium, typically a polymeric film. As used herein, the term "microcavity electrophoretic display" may be used to cover both encapsulated and microcell electrophoretic displays.

Microcavity electrophoretic displays have been used for numerous applications within devices such as wristwatches, e-book readers, newspapers, mobile phones, and electronic shelf labels. Unlike traditional light-emitting diode (LED) and liquid-crystal displays (LCD), electro-optic displays are highly flexible in the materials they can be constructed from. Numerous material options exist for use as the charged particles, media, electrodes, and the other various components. This unique versatility allows for display constructions that are highly tailored to individual applications.

All electronic devices require an energy source to operate, whether they are tied to an electric grid or powered through an energy storage device such as a battery containing electrochemical cells. Display systems that have large surface areas consume considerable amounts of power, especially display systems of the LCD type. Advancements in display technology, such as the electrophoretic display described above, require much less power when compared to backlit displays such as LCD's. However, even these energy efficient displays need a power source.

Traditional photovoltaic cells and combinations suggested in the art are used to drive active signs. However, these displays require a large surface area of photovoltaic cells placed away from the signage itself, such that the photovoltaic cells do not interfere with the display. Additionally, the large surface area of the photovoltaic cell needed to power the signage can become cumbersome.

Reflective displays, such as electrophoretic displays, operate well in ambient light conditions. However, when ambient light conditions are low, there may not be enough reflected light available for a viewer to effectively see the display. To combat this problem, LEDs or other light sources have been used to provide the necessary reflected light during low ambient light conditions. On the other hand, backlit displays including LCD displays, operate well in low ambient light conditions. However, LCD displays continuously drain power, and as a result, various solutions were developed that can be viewed in the art. For example, Yang et al. (Polarizing Organic Photovoltaics. Adv. Mater., 23: 4193-4198, 2011) discloses a photovoltaic cell that is capable of recycling wasted visible light from the backlight but introduces display distortions due to scattering light. Menendez-Velazquez et al. (Energy Environ. Sci., 2013, 6, 72-75) and U.S. Patent Application Publication No. 2011/0010911 solved this problem by converting the light to near-infrared (NIR) wavelengths, wherein the light was guided by a wave guide to an edge of the display to be absorbed by the photovoltaic cell.

U.S. Pat. No. 7,327,511 describes variable transmission devices including charged pigment particles that are distributed in a non-polar solvent and encapsulated. These variable transmission devices can be driven to an open state (light-transmissive) with an AC driving voltage whereby the charged pigment particles are driven to the capsule walls. Accordingly, such variable transmission devices are useful for viewing surfaces where it is desirable to alter the light transmissivity at will, such as privacy glass, sunroofs, and windows on buildings.

In view of the above information, there exists a need for novel electro-optic configurations that would expand the usage of electro-optic dynamic displays, creating new display applications.

SUMMARY OF THE INVENTION

In one aspect, the disclosure concerns with an energy harvesting electro-optic display. When viewed from above, i.e., from the viewing side of the display, the energy harvesting electro-optic display includes (a) a first fluorescent light concentrator, comprising a first fluorescent dye and a first light guide plate, the first light guide having a pair of opposed faces configured to propagate light along the length of the first light guide plate between the faces, (b) a first photovoltaic cell at one or both the faces of the first fluorescent light concentrator, (c) a first light-transmissive electrode layer, (d) an electro-optic material layer comprising light-transmissive gaps, (e) a backplane comprising a second electrode layer, (f) a second fluorescent light concentrator comprising a second fluorescent dye and a second light guide plate, the second light guide plate having a pair of opposed faces configured to propagate light along the length of the second light guide plate between the faces, and (g) a second photovoltaic cell at one or both the faces of the second light guide plate. The first fluorescent light concentrator absorbs ultraviolet light incident to the viewing side of the energy harvesting electro-optic display, reemits light of longer wavelength, and directs the reemitted light onto the first photovoltaic cell to be converted into electric current or voltage. The second fluorescent light concentrator absorbs light incident to the viewing side of the energy harvesting electro-optic display that traverses the electro-optic material layer, reemits the traversed light, and directs the reemitted light onto the second photovoltaic cell to be converted into electric current or voltage. The generated electric current or voltage is used for the operation of the electro-optic display upon the conversion or is stored in a storage component to be used for the operation of the electro-optic display at a later time.

The energy harvesting electro-optic display may further comprise a third light concentrator and a third photovoltaic cell. The third light concentrator comprises a third light guide plate, the third light guide plate having a pair of opposed faces configured to propagate light along the length of the third light guide plate between the faces. The third photovoltaic cell is located at one or both the faces of the third light concentrator. The third light concentrator is located between the first light concentrator and the electro-optic material layer. The third light concentrator absorbs light that is reflected by the electrophoretic material layer, and directs the absorbed light onto the third photovoltaic cell to be converted into electric current or voltage.

The electro-optic material layer of the energy harvesting electro-optic display may comprise an electrophoretic medium. The electrophoretic medium may be compartmentalized in capsules or microcells and the light-transmissive gaps can separate the capsules or microcells. The capsules or microcells may comprise electrophoretic particles in a non-polar electrophoretic liquid. In the case of an electrophoretic medium that is compartmentalized in capsules, the light-transmissive gaps may be light-transmissive beads, wherein the volume ratio of capsules to light-transmissive beads in the electrophoretic medium is from about 1:20 to about 1:3. The light-transmissive beads may have diameter of from about 10 to about 500 μm. In the case of an electrophoretic medium that is compartmentalized in microcells, the light-transmissive gaps may be the walls of the microcells, wherein the wall thickness of the microcells is from about 3 to about 120 μm. The walls of the microcells may comprise less than 0.2 weight percent of pigment or filler particles.

In another aspect, an energy harvesting electrophoretic display comprises in order from the viewing side: (a) a protective layer, (b) an electrophoretic display component comprising a first light-transmissive electrode layer, an electrophoretic material layer and a backplane comprising a second electrode layer, and (c) a photovoltaic layer comprising a photovoltaic element. The electrophoretic material layer comprises an electrophoretic medium that is compartmentalized in capsules or microcells, wherein the compartments are separated by light-transmissive gaps. The capsules or microcells comprise electrophoretic particles in a non-polar electrophoretic liquid. The photovoltaic element absorbs the portion of the incident light to the energy harvesting electrophoretic display that reaches the photovoltaic element via the electrophoretic display component and converts the absorbed light into electric current or voltage. The generated electric current or voltage is used for the operation of the electrophoretic display upon the conversion or stored in a storage component to be used for the operation of the electrophoretic display at a later time. In the case of electrophoretic material layer comprising capsules, the light-transmissive gaps may be light-transmissive beads. The volume ratio of capsules to light-transmissive beads in the electrophoretic material layer may be from about 1:20 to about 1:3. The light-transmissive beads may have diameter of from about 10 to about 500 µm. In the case of electrophoretic material layer comprising microcells, the light-transmissive gaps may be the walls of the microcells. The wall thickness may be from about 3 to about 120 µm. The walls of the microcells may comprise less than 0.2 weight percent of pigment or filler particles.

It is one advantage of the present invention to allow electrophoretic displays to exist in areas where there are no accessible power grids, or in various low power applications.

It is another advantage of the present invention to provide an electrophoretic display area that becomes capable of generating energy.

It is another advantage of the present invention to provide electrophoretic displays that contain a LGP that guides ambient or generated light to the edge of the display to be absorbed by a photovoltaic layer.

These and other features, aspects, and advantages of the present invention will become better understood upon consideration of the following detailed description, drawings and appended claims.

BRIEF DESCRIPTION OF THE DRAWINGS

To the extent possible, similar reference numerals are used to refer to like structures from Figure to Figure in the following description.

Figure 1:
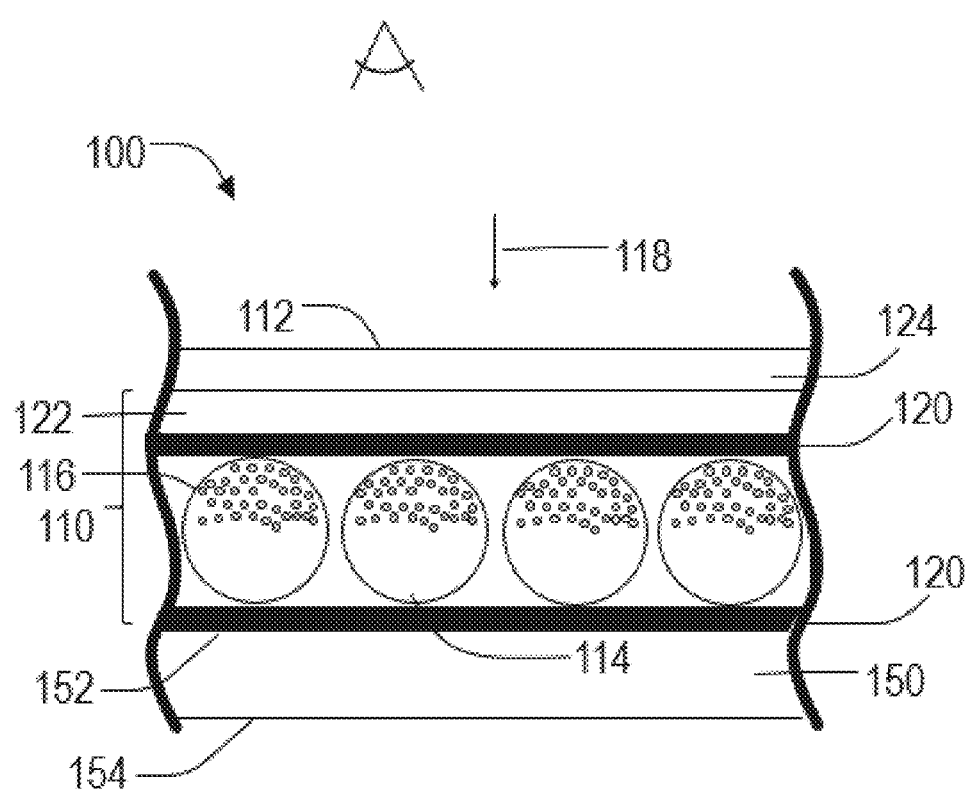
FIG. 1 is a detailed cross-sectional view of an embodiment of an energy harvesting electrophoretic display having a back photovoltaic layer.

The invention may be embodied in several forms without departing from its spirit or essential characteristics. The scope of the invention is defined in the appended claims, rather than in the specific description preceding them. All aspects that fall within the meaning and range of equivalency of the claims are therefore intended to be embraced by the claims.

DETAILED DESCRIPTION

A photovoltaic cell, also called a solar cell, is a device or a component of a device, which converts radiation energy directly into electrical energy by means of photovoltaic effect. Photovoltaic effect is the phenomenon that occurs when a semiconductor material absorbs light energy causing an electron excitation to a higher energy state and generating an electric potential.

A photovoltaic layer of an electro-optic display is a layer of the display that comprises a photovoltaic cell. The photovoltaic cell comprises one or more photovoltaic elements, which comprise a semiconductor material; the photovoltaic element has a surface, referred to as "top surface" of the photovoltaic element. "Top surface" of a photovoltaic element means the surface of the photovoltaic element onto which incident light contacts the photovoltaic element of the photovoltaic layer, initiating the generation of an electric current or a voltage. The term "top surface" is used for convenience and it does not necessarily mean that this surface is always horizontal or parallel to the viewing surface of the energy harvesting electro-optic display or that this surface is above the rest of the photovoltaic element.

A "viewing side" or a "viewing surface" of an energy harvesting electro-optic display means the side of the display on which the image is viewed by the viewer. In the case of variable transmission electrophoretic devices, the corresponding device may have two viewing sides or viewing surfaces.

"Incident light side" of an energy harvesting electro-optic display means the side of the display from which incident light enters the display, at least a portion of which interacts with the photovoltaic element of the photovoltaic layer to generate an electric current or a voltage.

For convenience, the term "light" is used herein, but this term should be understood in a broad sense to also include electromagnetic radiation at non-visible wavelengths. The term "light-transmissive" for a layer means that a layer so designed is viewed by an observer watching through that layer. For example, a light-transmissive electrode layer means that the electrode layer transmits sufficient light to allow for a layer underneath the light-transmissive electrode layer (for example, an electrophoretic material layer) to be visible through the light-transmissive electrode layer and the adjacent substrate, if present. The light-transmittance is measured as % total transmittance, which is the ratio of total energy of transmitted light from the layer to the energy of the incident light×100. The % total light transmittance is measured by standard method ISO 13468 using D65 illuminant and a UV-Visible spectrophotometer, unless otherwise stated. An electrode layer is light-transmissive if it has total light transmittance of higher than 70%.

A "front photovoltaic layer" or "front photovoltaic cell" of an energy harvesting electrophoretic display is a photovoltaic layer or a photovoltaic cell, which is located between the viewing side of the energy harvesting electro-optic display and the electro-optic material layer. A "back photovoltaic layer" or "back photovoltaic cell" of an energy harvesting electro-optic display is a photovoltaic layer or a photovoltaic cell, which is not located between the viewing side of the energy harvesting electro-optic display and the electro-optic material layer. The term "front photovoltaic layer", "front photovoltaic cell", "back photovoltaic layer" and "back photovoltaic cell" are not used for energy harvesting electro-optic display that have two viewing sides.

As the surface area of mobile devices available for energy harvesting is finite, and the display takes up most, if not all, of the device's surface of the viewing side, it would be optimal that the display surface area itself was used for energy harvesting. In reflective displays, in particular electrophoretic displays, front photovoltaic layers should not cause a significant light absorption or light scattering as this would decrease the display's white state, color gamut, readability and image quality. A photovoltaic layer can be incorporated into conventional displays in order to reduce the size of the battery for the device (and the weight of the device), and to increase the time between recharging events. In some applications, the incorporation of photovoltaic layers may enable the displays to operate without a battery. Furthermore, electrophoretic displays that are already fitted with front LGPs may incorporate photovoltaic cells to harvest energy from incident light that would be otherwise wasted.

An electro-optic display normally comprises a layer of electro-optic material and at least two other layers disposed on opposed sides of the electro-optic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electro-optic display, which is intended for use with a stylus, print head or similar movable electrode separate from the display, only one of the layers adjacent the electro-optic layer comprises an electrode, the layer on the opposed side of the electro-optic layer typically being a protective layer intended to prevent the movable electrode damaging the electro-optic layer.

Numerous patents and applications assigned to or in the names of the Massachusetts Institute of Technology (MIT) and E Ink Corporation describe various technologies used in encapsulated electrophoretic and other electro-optic media. The technologies described in the these patents and applications include:

(a) Electrophoretic particles, fluids and fluid additives; see for example U.S. Pat. Nos. 7,002,728; and 7,679,814;

(b) Capsules, binders and encapsulation processes; see for example U.S. Pat. Nos. 6,922,276; and 7,411,719;

(c) Microcell structures, wall materials, and methods of forming microcells; see for example U.S. Pat. Nos. 7,072,095; and 9,279,906;

(d) Methods for filling and sealing microcells; see for example U.S. Pat. Nos. 7,144,942; and 7,715,088;

(e) Films and sub-assemblies containing electro-optic materials; see for example U.S. Pat. Nos. 6,982,178; and 7,839,564;

(f) Backplanes, adhesive layers and other auxiliary layers and methods used in displays; see for example U.S. Pat. Nos. 7,116,318; and 7,535,624;

(g) Color formation and color adjustment; see for example U.S. Pat. Nos. 7,075,502; and 7,839,564;

(h) Methods for driving displays; see for example U.S. Pat. Nos. 7,012,600; and 7,453,445;

(i) Applications of displays; see for example U.S. Pat. Nos. 7,312,784; and 8,009,348;

(j) Non-electrophoretic displays, as described in U.S. Pat. No. 6,241,921; and U.S. Patent Application Publication Nos. 2015/0277160; 2015/0005720; and 2016/0012710;

(k) Multi-color electro-optic displays, as described in U.S. Pat. No. 8,576,476.

The invention will now be described more specifically with reference to the following aspects. It is to be noted that the following aspects are presented herein for purpose of illustration and description only. It is not intended to be exhaustive or to be limited to the precise form disclosed.

It is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Furthermore, the disclosed subject matter may be implemented as a system, method, apparatus, or article of manufacture using standard programming and/or engineering techniques and/or programming to produce hardware, firmware, software, or any combination thereof to implement aspects detailed herein.

As used herein, the term "controller" may include one or more processors and memories and/or one or more programmable hardware elements. As used herein, the term "controller" is intended to include any types of processors, CPUs, microcontrollers, digital signal processors, or other devices capable of executing software instructions.

In one aspect, an energy harvesting electro-optic display of the present invention comprises an electro-optic component and at least one photovoltaic cell. The electro-optic component comprises a first light-transmissive electrode layer, an electro-optic material layer, and a backplane comprising a second electrode layer. The electro-optic material layer comprises light-transmissive gaps. The energy harvesting electro-optic display may comprise an electrophoretic display component comprising an electrophoretic material layer. This type of energy harvesting electro-optic display may be also called energy harvesting electrophoretic display. The electrophoretic display component of the energy harvesting electrophoretic display comprises a first light-transmissive electrode layer, an electrophoretic material layer, and a backplane comprising a second electrode layer. The electrophoretic material layer comprises an electrophoretic medium that is compartmentalized in capsules or microcells, wherein the capsules or microcells comprise electrophoretic particles in a non-polar electrophoretic liquid.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and another display state is light-transmissive. See, for example, U.S. Pat. Nos. 5,872,552, 6,130,774, 6,144,361, 6,172,798, 6,271,823, 6,225,971, and 6,184,856. Dielectrophoretic displays, which are similar to electrophoretic displays but rely upon variations in electric field strength, can operate in a similar mode (see U.S. Pat. No. 4,418,346). Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface. The corresponding devices are also referred to as variable transmission devices. Electrophoretic displays, which are not variable transmission devices, may be designed to have somewhat light-transmissive electrophoretic media by having light-transmissive gaps, such as light-transmissive beads in the case of electrophoretic material layers comprising capsules, or such as light-transmissive microcell walls in the case of electrophoretic material layers comprising microcells.

One type of electro-optic display, which has been the subject of intense research and development for a number of years, is the particle-based electrophoretic display, in which a plurality of charged particles moves through a non-polar electrophoretic liquid under the application of an electric field. Electrophoretic displays can have attributes of good brightness and contrast, wide viewing angles, state bistability, and low power consumption when compared with liquid crystal displays. As noted above, electrophoretic media require the presence of a fluid. In most prior art electrophoretic media, this fluid is a liquid. As used herein, "bistable" refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element.

An electrophoretic display normally comprises an electrophoretic material layer and at least two other layers disposed on opposed sides of the electrophoretic material layer, one of these two layers being an electrode layer. In most such displays, both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic material layer comprises an electrode, the layer on the opposed side of the electrophoretic material layer typically being a protective layer intended to prevent the movable electrode damaging the electrophoretic material layer.

The manufacture of a three-layer electrophoretic display normally involves at least one lamination operation. For example, a process for manufacturing an encapsulated electrophoretic display, encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium (an electrophoretic material layer) firmly adhered to the substrate. Separately, a backplane, comprising an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. One lamination technique for mass production of displays by this process is roll lamination using a lamination adhesive.

As already noted, an encapsulated electrophoretic medium typically comprises electrophoretic capsules disposed in a polymeric binder, which serves to form the discrete capsules into a coherent layer. The continuous phase in a polymer-dispersed electrophoretic medium, and the cell walls of a microcell medium serve similar functions. It has been found that the specific material used as the binder in an electrophoretic material layer can affect the electro-optic properties of the medium.

Referring now to FIG. 1, there is shown an embodiment of an energy harvesting electrophoretic display 100. The energy harvesting electrophoretic display 100 includes a protective layer 124, an electrophoretic display component 110 and a photovoltaic layer 150. The electrophoretic display 100 has an incident light side 112. The electrophoretic display component 110 comprises an electrophoretic material layer comprising capsules 114 having charged electrophoretic particles 116, and front and back light transmissive electrodes 120. It may also include one or more adhesive layers 122. A photovoltaic layer 150 is located under the electrophoretic display component 110. This back photovoltaic layer comprises a photovoltaic cell with a photovoltaic element having a top surface 152, and a bottom surface 154 opposite the top surface. The top surface 152 of the photovoltaic element of the photovoltaic layer 150, receive at least a portion of the incident light 118. The photovoltaic layer 150 may act as a substrate for the energy harvesting electrophoretic display 100, or the energy harvesting electrophoretic display 100 may include an additional substrate to provide structural support (not shown).

The electrophoretic display component 110 includes an electrophoretic material layer comprising capsules 114 with electrophoretic media in a polymeric binder. The capsules contain charged pigment particles 116 that move in response to an electric field. The capsules 114 are typically formed from gelatin materials and have average diameter of about 10 to about 120 µm, preferably from about 20 to about 60 µm. The electrophoretic material layer is disposed between first and second electrode layers 120, which may be made from known materials such as indium-tin oxide (ITO) coated polyethylene terephthalate (PET). Alternatively, an electrode layer may comprise a light transmissive polymer, which is doped with conductive elements, such as carbon nanotubes, metal flakes, metal whiskers, graphene, etc. The electrode layers may be continuous; one of them may be arranged as pixels. The pixels may be controllable as an active matrix, thereby allowing for the display of text and pictures. An additional adhesive layer 122 is typically present between the electrophoretic material layer and one of the electrode layers. The adhesive layer 122 may be formed via UV curable monomers or oligomers. It typically improves the planarity of the final device by filling in deviations created by the capsules 114. Suitable adhesive formulations are described in U.S. 2017/0022403, which is incorporated by reference herein.

Figure 2A:
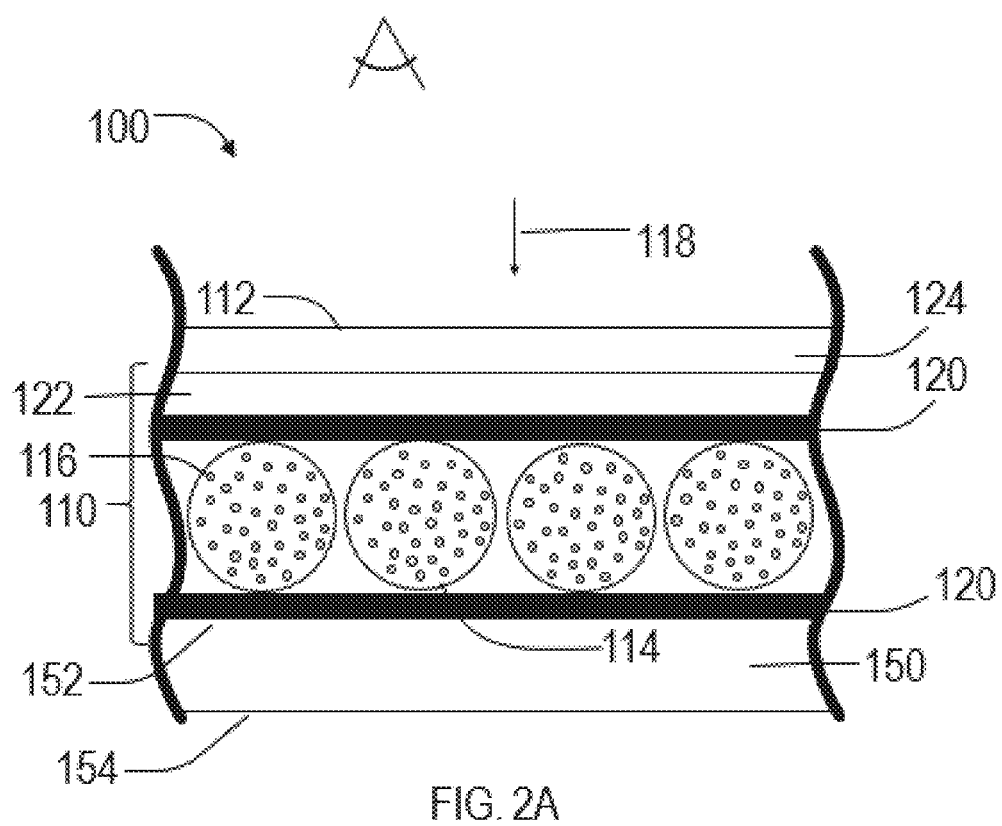
FIGS. 2A and 2B is a detailed cross-sectional view of the energy harvesting electrophoretic display of FIG. 1, showing the energy harvesting electrophoretic display operating in a closed and an open state respectively.
Figure 2B:
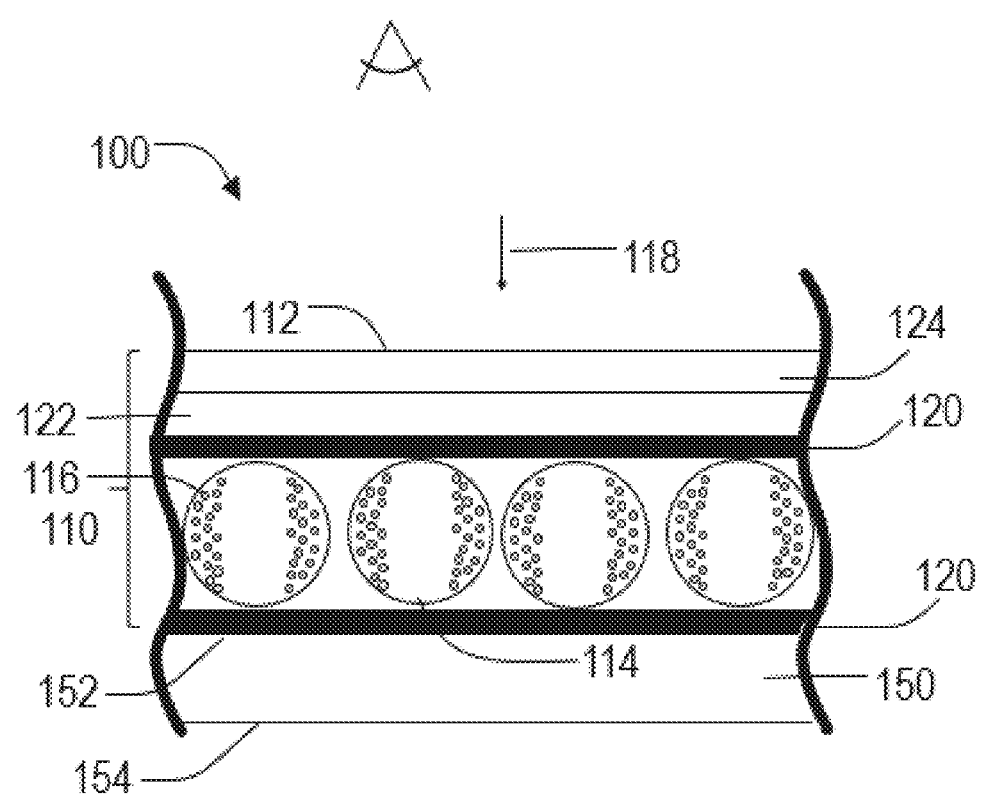
Figure 3:
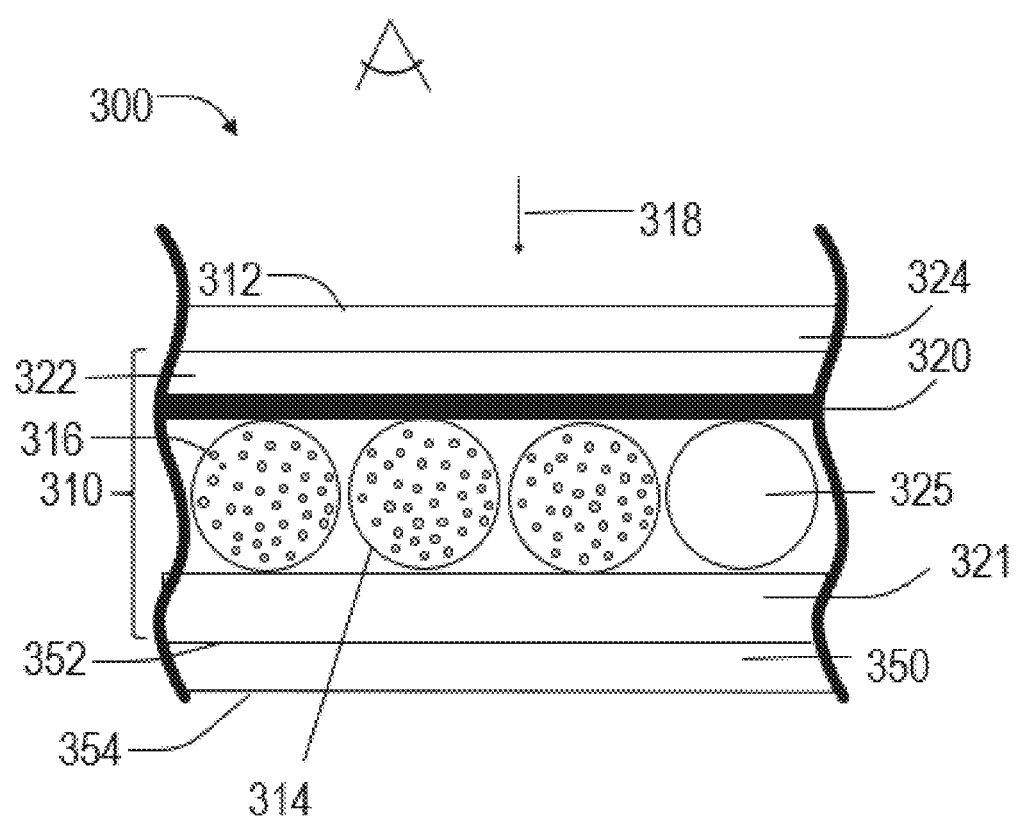
FIG. 3 is a detailed transverse cross-sectional view of an embodiment of an energy harvesting electrophoretic display comprising an electrophoretic material layer comprising capsules and light-transmissive beads, and a back photovoltaic layer.
Figure 4:
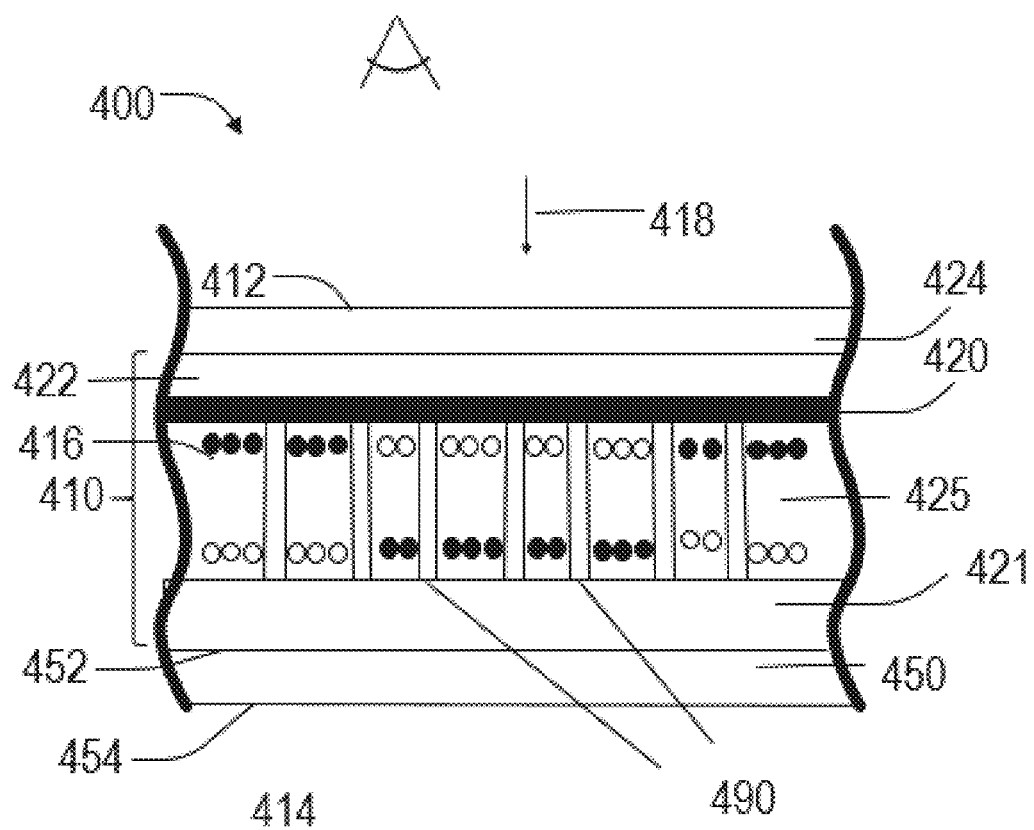
FIG. 4 is a detailed transverse cross-sectional view of an embodiment of an energy harvesting electrophoretic display comprising an electrophoretic material layer comprising microcells and gaps, and a back photovoltaic layer.
Figure 5:
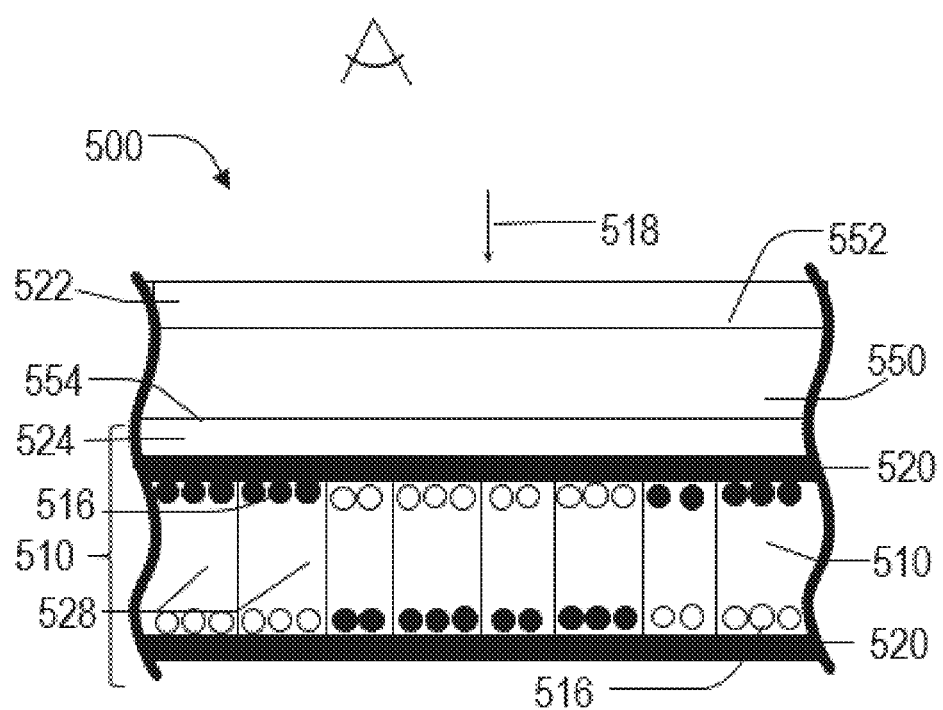
FIG. 5 is a detailed transverse cross-sectional view of an embodiment of an energy harvesting electrophoretic display comprising an electrophoretic material layer with microcells and a front photovoltaic layer.

When a DC voltage is applied across the electrophoretic material layer via the electrodes 120 of the device of FIG. 1, the charged electrophoretic particles 116 may move within the capsule toward the incident light side 112 of the electrophoretic display, thereby changing the optical state of the display 100. If the charged electrophoretic particles 116 are white, light scattering particles, the resulting optical state of the display is white. This feature is known in the art, for example U.S. Patent Publication No. 2018/0366069. Alternatively, an alternating electric field can be applied to the electrophoretic material layer via the electrodes to uniformly distribute the light scattering charged electrophoretic particles 116 throughout the encapsulated medium, as shown in FIG. 2A. As illustrated in FIG. 2B, when a different alternating electric field is applied, the charged electrophoretic particles 116 are driven to the walls of the capsule 114, resulting in a pathway through the capsule for the transmission of incident light 118, i.e., an open state. It is understood that the electrophoretic display component 110 could, alternatively, include charged electrophoretic particles 116 contained within microcells (also called microcups), as shown in FIGS. 3, 4, and 5.

When in the open state (shown in FIG. 2B), a viewer who observes the energy harvesting electrophoretic display 100 from the incident light side 112 of the electrophoretic display would see the photovoltaic layer 150, which comprises a photovoltaic cell having a photovoltaic material. Because the electrophoretic liquid is non-polar and the electrophoretic medium comprises charge control agents and/or stabilizers, the desired optical state can be maintained for a long time without the need to maintain the electric field (i.e., a bistable medium). As a result, when the devices are "switched" only a few times a day, they consume very little power. Furthermore, because the photovoltaic layer 150 is exposed to a portion of the incident light 118, the energy harvesting electrophoretic display 100 can collect energy to, for example, charge a battery or capacitor to provide switching power for later state transitions. In some embodiments, the energy harvesting electrophoretic display 100 is programmed to go to sleep in an all open state, thereby allowing maximum energy harvesting.

An electrophoretic display normally comprises an electrophoretic material layer and at least two other layers disposed on opposed sides of the electrophoretic material layer, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic material layer comprises an electrode, the layer on the opposed side of the electrophoretic material layer typically being a protective layer intended to prevent the movable electrode damaging the electrophoretic material layer. If the front or back electrodes 120 are segmented or otherwise include regions of independent control, the energy harvesting electrophoretic display can display patterns, i.e., text or images, when desired by having some portions of the display in the closed (white) state, while other portions are in the open (dark) state. For example, the energy harvesting electrophoretic display 100 may show segmented numbers advertising the price of gasoline.

Photovoltaic layers comprise photovoltaic cells suitable for use with an energy harvesting electrophoretic display 100. These include polysilicon photocells, amorphous silicon photocells, organic photovoltaic cells, or specialty materials, such as cadmium telluride or copper indium gallium diselenide. The cells may be printed or fabricated with lithographic techniques. Suitable photovoltaic cells can be purchased from, for example, E-ton Solar Tech, Ltd., Tainan City, Taiwan.

FIG. 2B shows the electrophoretic display component 110 operating in a mode wherein the charged electrophoretic particles 116 have congregated to the walls of the capsules, e.g., after being driven with a suitable alternating voltage. While it is not shown in FIGS. 1, 2A, and 2B, it is understood that the electrophoretic display component 110 is coupled to a controller configured to provide an alternating voltage signal between the first and second light transmissive electrode layers 120 to drive the particles between an open and a closed states. In FIG. 2B, much of the incident light 118 traverses the incident light side 112 of the electrophoretic display. A portion of this light reaches the top surface 152 of the photovoltaic element of the photovoltaic layer 150, where the light is absorbed and harvested to produce electrical energy.

FIG. 2A shows the electrophoretic display component 110 operating in a mode where the charged electrophoretic particles 116 are uniformly distributed throughout the electrophoretic medium, thus most of the incident light 118 is reflected by the charged electrophoretic particles 116. In this state, a viewer sees a white state. With the use of segmented electrodes or an active matrix of pixels the white and dark states can define images.

In an alternative embodiment, the charged electrophoretic particles 116 may be engineered to transmit non-visible light, thereby allowing those wavelengths to reach the top surface 152 of the photovoltaic element of the photovoltaic layer 150, wherein the photovoltaic layer is of a type that generates electrical power by absorbing non-visible light wavelengths, such as near infrared or ultraviolet. Photovoltaic cells that use non-visible light are available from, for example, Ubiquitous Energy, Redwood City, Calif.

In one embodiment, the energy harvesting electrophoretic display 300 has only one viewing side, which is the same side as the incident light side. The viewing side 312 is the side from which the image of the electrophoretic display component is viewed by the viewer. The energy harvesting electrophoretic display 300 comprises a photovoltaic layer 350, which is not located between the viewing side and the electrophoretic material layer, as shown in FIG. 3. That is, the energy harvesting electrophoretic display has a back photovoltaic layer. The energy harvesting electrophoretic display 300 comprises a protective layer 324, an electrophoretic display component 310 and a photovoltaic layer 350. The energy harvesting electrophoretic display 300 has an incident light side 312. The electrophoretic display component 310 comprises a front light-transmissive electrode 320, an electrophoretic material layer comprising capsules 314 having charged electrophoretic particles 316 and light-transmissive beads 324, and a backplane 321 comprising a back electrode. It may also comprise an adhesive layer 322. The light-transmissive beads are light-transmissive gaps in the electrophoretic material layer that contribute so that a portion of the incident light 318 reaches the back photovoltaic layer. The volume ratio of capsules to light-transmissive beads of the electrophoretic material layer is from about 1:20 to 1:3, from about 10:90 to about 1:1, or from about 1.5:1 to about 3:1. The electrophoretic display component 310 may also include one or more adhesive layers 322. The photovoltaic layer 350, which located beneath the electrophoretic display component 310, comprises a photovoltaic cell with a photovoltaic element having a top surface 352, and a bottom surface 354 opposite the top surface. The top surface 352 of the photovoltaic element of the photovoltaic layer 350, receive at least a portion of the incident light 318. The photovoltaic layer 350 may act as a substrate for the energy harvesting electrophoretic display 300, or the energy harvesting electrophoretic display 300 may include an additional substrate to provide structural support (not shown). Light-transmissive beads 325 are solid or semi-solid particles, insoluble in the electrophoretic liquid of the electrophoretic medium. The beads 325 may be spheres, rods, cones, pyramids, cones, or other shapes; they may comprise glass, polymers, or combinations thereof. The average size of the light-transmissive beads 325 (average diameter in the case of a sphere or average of the largest dimension in the case of other shapes) may be from about 10 to about 500 µm, from about 20 to about 100 µm, or from about 20 to about 80 µm. The beads 325 are light-transmissive, which means that a dispersion made from 90 weight percent Isopar G and 10 weight percent beads in a 12.4 mm×12.4 mm quartz cuvette has 90% total light transmittance or higher. The light-transmittance is measured as % total transmittance, which is the ratio of total energy of transmitted light from the layer to the energy of the incident light×100, measured between wavelengths of 400 and 800 nm. The inclusion of light-transmissive beads 324 in the electrophoretic medium of the energy harvesting electrophoretic display 300, enables the increase of the portion of the incident light 318 that reaches the top surface 352 of the photovoltaic cell, even in the case of conventional electrophoretic displays that do not have two viewing sides and no capability of having an open state, which is shown in FIG. 2B). The lower the volume ratio of capsules to light-transmissive beads is, the higher the portion of the incident light that reaches the top surface of the photovoltaic cell 352 and the higher the electric current or voltage that is generated by the photovoltaic cell. However, very high ratios, may negatively affect the electro-optic performance of the display.

In another embodiment, the electrophoretic medium layer of the energy harvesting electrophoretic display 300 of FIG. 3 is replaced by an electrophoretic medium layer that comprises a plurality of microcells instead of capsules (and light-transmissive beads). An example is shown in FIG. 4. This is an energy harvesting electrophoretic display 400 having a back photovoltaic layer 450. The energy harvesting electrophoretic display 400 comprises a protective layer 424, an electrophoretic display component 410 and a back photovoltaic layer 450. The energy harvesting electrophoretic display 400 has an incident light side 412. The electrophoretic display component 410 comprises a front light-transmissive electrode 420, an electrophoretic material having a plurality of microcells 425, and a backplane 421 comprising a back electrode. It may also comprise an adhesive layer 422. The photovoltaic layer 450, which located beneath the electrophoretic display component 410, comprises a photovoltaic cell with a photovoltaic element having a top surface 452, and a bottom surface 454 opposite the top surface. The top surface 452 of the photovoltaic element of the photovoltaic layer 450, receive at least a portion of the incident light 418. The photovoltaic layer 450 may act as a substrate for the energy harvesting electrophoretic display 400, or the energy harvesting electrophoretic display 400 may include an additional substrate to provide structural support (not shown). As mentioned above, the electrophoretic display component 410 of the energy harvesting electrophoretic display 400 of FIG. 4, comprises a plurality of microcells 425. The microcell cavities 425 comprise electrophoretic medium with electrophoretic particles in a non-polar liquid. The microcell cavities are separated by microcell walls 490. The horizontal cross section of the microcells 425 may have various shapes, for example, square, round or polygonal, such as a honeycomb structure. The longest dimension of the diameter of each microcell may be from about 40 to about 300 µm, from about 50 to about 180 µm, or from about 60 to about 160 µm. Each microcell comprises electrophoretic medium with electrophoretic particles in a non-polar liquid and a sealing layer, which seals the microcell opening. The walls may have thickness from about 3 to about 120 µm, from about 6 to about 80 µm, or from about 7 to about 40 µm. The wall thickness may occupy from about 5% to about 75%, from about 10% to about 50%, or from about 12% to about 25% of the active surface area of the electrophoretic display component of the energy harvesting electrophoretic display. The walls of the microcells are light-transmissive gaps in the electrophoretic material layer that contribute so that a portion of the incident light 418 reaches the back photovoltaic layer. The walls of the microcells of electrophoretic displays are constructed from a polymeric material comprising pigment or filler particles. These particles increase the opacity of the walls and improve the elector-optic performance as disclosed in U.S. Pat. No. 6,829,078. On the contrary, the walls of the inventive energy harvesting electrophoretic display of FIG. 4 are made of polymeric material comprising less than 0.2 weight percent pigment or filler particles. This results in an increase in the light-transmittance of the electrophoretic material layer, which leads to a largest portion of the incident light 418 reaching the back photovoltaic layer to generate more electric current or voltage. That is, the higher the light-transmittance of the microcell walls of the electrophoretic material layer, the more effective the energy harvesting of the energy harvesting electrophoretic display. Higher light-transmittance can be achieved by lower weight percent of particles in the polymeric material and by thicker microcell walls. The light-transmittance of the electrophoretic material layer of the energy harvesting electrophoretic display 400 is from about 5 to about 75%, or from about 10% to about 50%, or from about 12% to about 25%. The light-transmittance of the electrophoretic material layer is measured as % total transmittance, which is the ratio of total energy of transmitted light from the layer to the energy of the incident light×100. The % total light transmittance is measured by standard method ISO 13468 using D65 illuminant and a UV-Visible spectrophotometer.

The invention is not limited to a back photovoltaic layer, which is a photovoltaic layer behind the electrophoretic material layer, as viewed in FIGS. 1, 2A and 2B. Alternatively, or in conjunction, a light-transmissive photovoltaic layer comprising a photovoltaic cell can be a front photovoltaic layer. A front photovoltaic layer is a photovoltaic layer that is located between the viewing surface of an energy harvesting electrophoretic display and the electrophoretic material layer. For example, a front photovoltaic layer may only capture ultraviolet and near infrared wavelengths, while passing the visible light through to the electrophoretic layer below. Typically, such a photovoltaic layer will be at least 80% transmissive to light having wavelengths between 400 nm and 700 nm. A visible light-transmissive photovoltaic cell is available from Ubiquitous Energy. Alternatively, a dye-sensitized solar cell can be employed to capture only certain visible wavelengths, while allowing other wavelengths to pass through. A dye sensitized solar cell (DSSC) material suitable for use is available from Solaronix S.A. (Aubonne, Switzerland). Furthermore, architectural or decorative designs can be created by choosing DSSCs of particular wavelength absorptions to achieve the desired colors or effects. A dye sensitized solar cell may be on average at least 80% transmissive to light having wavelengths between 400 nm and 700 nm; however, it may have a band of absorption that is less than 80% corresponding to the spectrum of the dye.

An exemplary embodiment of an energy harvesting electrophoretic display 500 comprising a front photovoltaic layer is shown in FIG. 5. The energy harvesting electrophoretic display 500 includes an electrophoretic display component 510 having microcells 528, charged electrophoretic particles 516, and electrodes 520. It is understood that the electrophoretic display component 510 could, alternatively, include charged electrophoretic particles 516 contained within capsules, instead of microcells, as shown in FIGS. 1, 2A and 2B. The energy harvesting electrophoretic display also includes a protective layer 522, an adhesive layer 524, and a front photovoltaic layer 550. The front photovoltaic layer 350 has a photovoltaic element having a top surface 552 and a bottom surface 554 opposite the top surface. The top surface 552 of the photovoltaic element of the photovoltaic layer 550 receives at least a portion of the incident light 518. The photovoltaic element of the photovoltaic layer 550 of the energy harvesting electrophoretic display 500 collects primarily non-visible light, e.g., near infrared and/or ultraviolet light, thereby transmitting the remaining visible light to the electrophoretic display component 510, where the visible light interacts with the black and white charged electrophoretic particles 516 as in a typical black and white electrophoretic display. The photovoltaic cell of the photovoltaic layer 550 may also be a dye-sensitized solar cell, wherein the light that interacts with the electrophoretic particles 516 will have some of the visible light removed; this may give a tint to the display. Of course, the electrophoretic display component 510 is not limited to black and white or only two particles, as other colored and multi-particle electrophoretic displays such as described in U.S. Pat. Nos. 8,717,664, 9,170,468, and 9,921,451 could also be incorporated in an energy harvesting electrophoretic display 500 comprising a front photovoltaic layer 550. Similar to the embodiments of FIGS. 1 and 2, the electrodes may be segmented, continuous, or part of an active matrix of pixel electrodes. An energy harvesting electrophoretic display 500 having a front photovoltaic layer is always able to harvest power when ambient light is sufficient, regardless of the display state of the electrophoretic display component 510.

Figure 6:
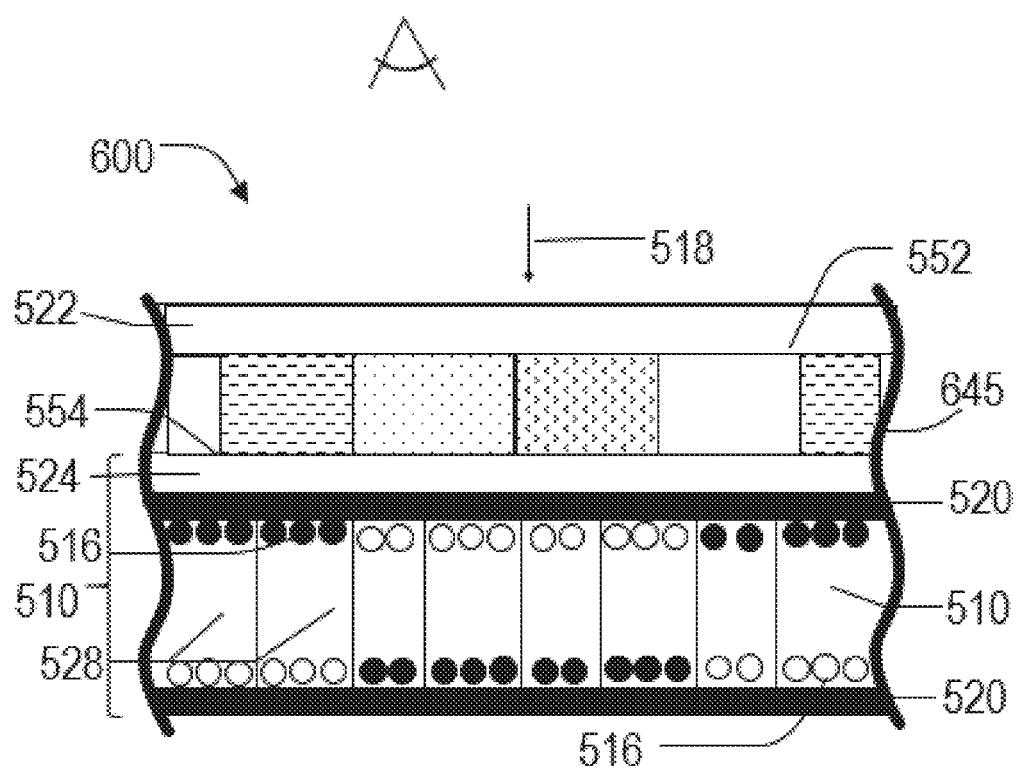
FIG. 6 is a detailed transverse cross-sectional view of an embodiment of an energy harvesting electrophoretic display wherein the front photovoltaic layer is also a color-filter array.
Figure 7:
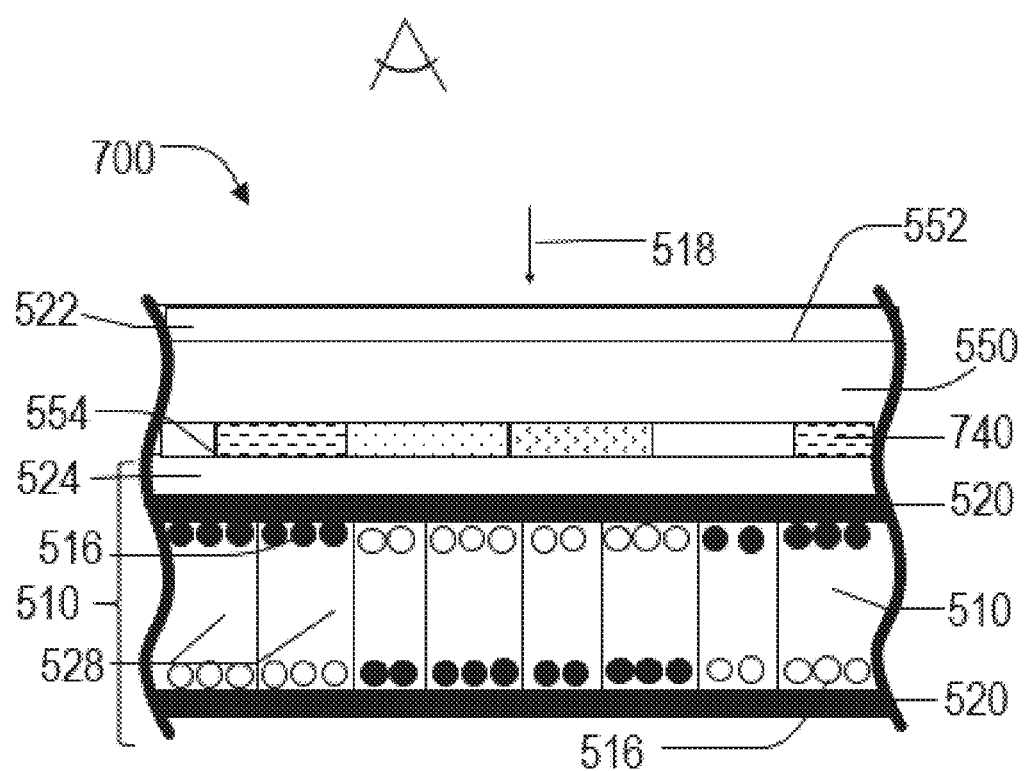
FIG. 7 is a detailed transverse cross-sectional view of an embodiment of an energy harvesting electrophoretic display wherein the front photovoltaic layer and a color-filter array are separate layers.

In some embodiments, dye-sensitized solar cells may comprise different dyes, and thus have different colors. The dyes can be incorporated into an energy harvesting electrophoretic display having a front photovoltaic layer that acts as a color filter. As shown in FIG. 6, three different types of dye-sensitized solar cell materials can be incorporated into a regular pattern, creating a red, green, blue, white color filter array (CFA) 645. Of course, other suitable colors may also be used, and fewer or greater colors may be used, such as a one-color CFA, a two-color CFA, a three-color CFA, a five-color CFA, a six-color CFA, a seven-color CFA, or an eight-color CFA. In an alternative embodiment shown in FIG. 7, an energy harvesting electrophoretic display 700 having a front photovoltaic layer may include a substantially visible-light transmissive photovoltaic layer 550, similar to the one shown in FIG. 5; however a conventional color filter array 740 is incorporated into the device above the electrophoretic display component 510. The design of FIG. 7 is likely to be easier to implement than FIG. 6, because the CFA 740 must be aligned to the pixel electrodes, and it is easier to align a very thin sheet of CFA.

Figure 8:
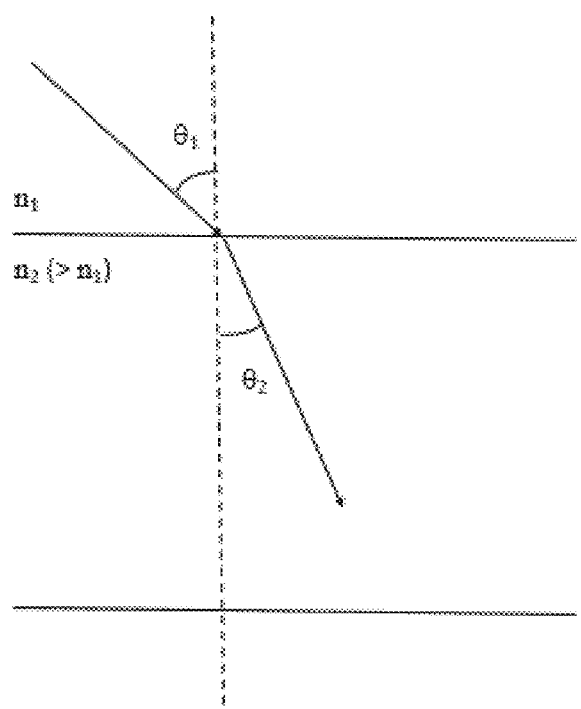
FIG. 8 describes the concept in light refraction, which is used by LGP to achieve Total Internal Reflection (TIR).

In some embodiments, a LGP may be used in energy harvesting electrophoretic displays. A typical LGP is transparent and made from glass or a polymeric resin. It is used to transport light from one location to another by means of total internal reflection (TIR) at the boundary to the surrounding medium. When an incident light ray coming via a transparent medium (having refractive index $n_1$) hits the boundary surface of the LGP, the LGP having refractive index $n_2$, which is higher than $n_1$) at an incident angle $\theta_1$, it is refracted by a refraction angle $\theta_2$ as depicted in FIG. 8. Snell's law of Equation 1 describes this phenomenon.

$$n_1 \cdot \sin(\theta_1) = n_2 \cdot \sin(\theta_2) \qquad \text{Equation 1}$$

If the medium surrounding the LGP has refractive index lower than the refractive index of the LGP and the angle of incident light onto the LGP is greater than the critical angle $\theta_c$, total internal reflection occurs. The critical angle is defined as $\theta_c = \sin^{-1}(n_1/n_2)$. Total internal reflection means that the corresponding light rays remain trapped inside the LGP and they can be directed towards a photovoltaic element at the edge of the LGP to be converted to electric current or voltage.

A front LGP is a LGP that is located between the viewing side of the energy harvesting electrophoretic display and the electrophoretic material layer.

Figure 9A:
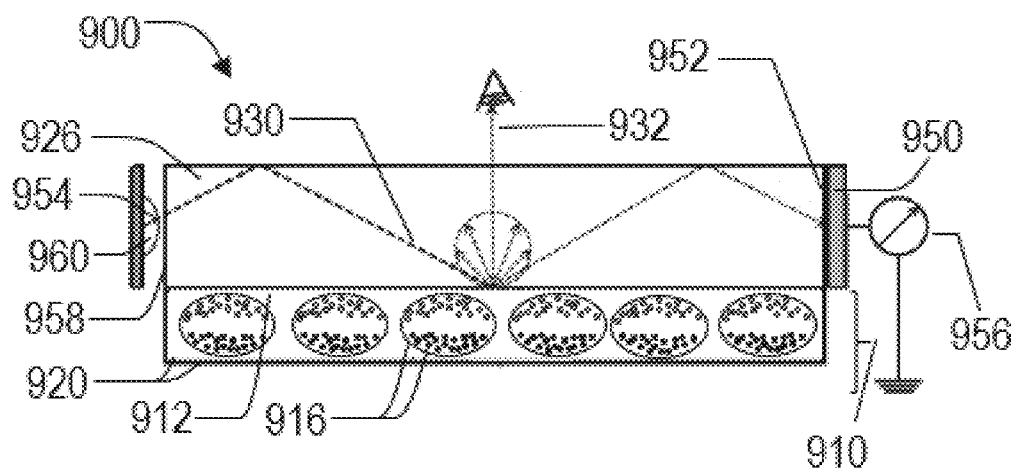
FIGS. 9A and 9B is a detailed cross-sectional view of an embodiment of an energy harvesting electrophoretic display of the present disclosure.
Figure 9B:
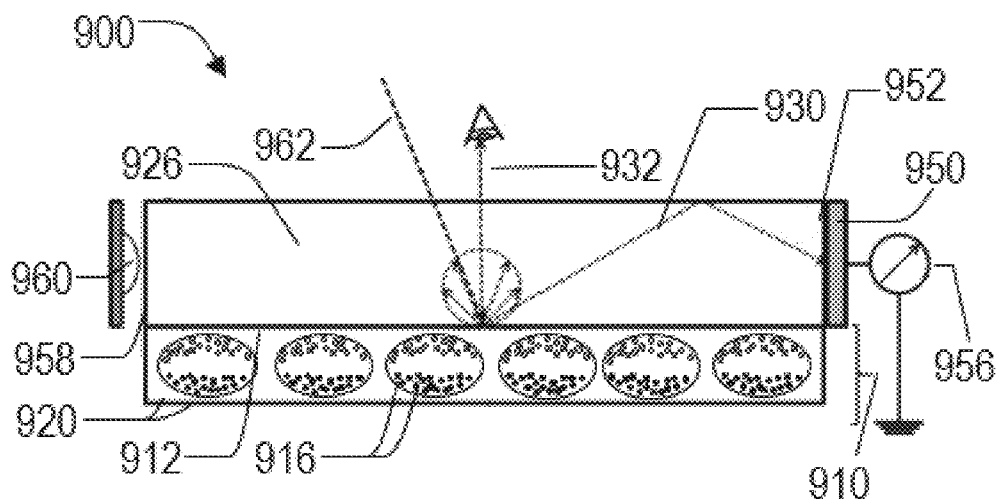

Turning now to FIGS. 9A and 9B, an alternative embodiment of an energy harvesting electrophoretic display 900 is shown, in which light energy 930 is captured inside a front LGP 926.

Reflective electrophoretic displays may consist of an active electrophoretic material layer with charged pigment particles suspended in a liquid phase, compartmentalized in capsules or microcells, bounded by segmented or pixelated transparent electrodes, and protected on the viewing side of the display by a clear glass or plastic sheet, which is optically bonded to the electrophoretic material layer by a transparent, often index-matched adhesive layer. In many embodiments, e.g., an eReader, a front LGP 926 is optically bonded to the protective sheet (not shown), or directly to the planarization adhesive. The front LGP 926 typically includes a waveguide plate where Total Internal Reflection (TIR) traps the light 930 between its two surfaces as well as (optional) light turning features to direct a portion of the light towards the electrophoretic material layer. The LGP 926 is coupled to an edge-mounted light source (LED) 960. Light 930 emitted by the LEDs 960 is coupled into the LGP 926 and travels laterally by means of TIR. The portion of light 930 not directed towards the electrophoretic material layer will exit the LGP 926 at its edges 952. Often the light turning features and their spatial distribution within the LGP are optimized for light 930 traveling in one direction (away from the LEDs 960); thus, the light 930 is not reflected back into the LGP 926, but it is absorbed to avoid the LGP 926 producing additional haze, which would lower contrast ratio and color gamut. The energy of this wasted light can be harvested by placing photovoltaic cell 950 at the edge of the light plate opposite to the LED's 960, or even on the three edges not occupied by the LEDs (not shown). In addition, a portion of the ambient light 962 diffusely reflected by the electrophoretic material layer and entering the LGP 926 at angles greater than the critical angle of TIR will not be directed back to the viewer but trapped within the LGP 926 and traveling towards its edges. This portion of ambient light is also available to be harvested by the photovoltaic cell 950.

The energy harvesting electrophoretic display 900 shown in FIGS. 9A and 9B includes an electrophoretic display component 910 having an incident light side 912, particles 916, and electrodes 920. The energy harvesting electrophoretic display 900 also includes a light source 960, a photovoltaic cell 950, and a LGP 926. The LGP 926 traps a portion of the ambient light 962 and/or the generated light 954, such that the trapped light is total internally reflected light 930 and is delivered to the top surface 952 of the photovoltaic cell 950. The top surface 952 of the photovoltaic element of the photovoltaic cell 950 faces the lateral edge 958 of the LGP 926. The energy harvested from the photovoltaic cell 950 can be used to power the electrophoretic display component 910 or can be stored in the energy storage device 956. Some portions of the ambient light 962 or generated light 954 reflect off the particles 916 and thus become reflected light 932 allowing the user to see the electrophoretic display 910.

The amount of ambient light energy harvested by the photovoltaic cell can be increased if the photovoltaic element is sensitive to near-infrared (NIR) as it is the case with Si photodiodes (sensitive to NIR up to 1100 nm). This is especially relevant in ambient daylight with its high proportion of NIR. A light sensor and required computer logic could be added to set a threshold for when the light source 960 should be turned on based off the levels of incident diffuse light flux 964.

Figure 10:
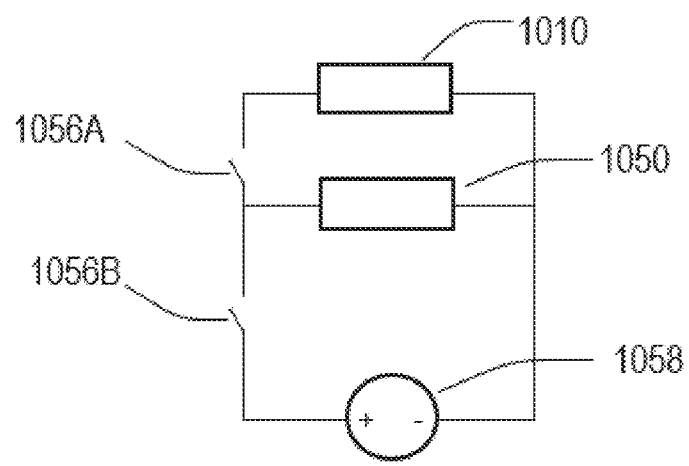
FIG. 10 is a schematic of a circuit for powering any of the energy harvesting electro-optic displays of this disclosure.

In any of the previous embodiments of energy harvesting electro-optic displays, or in the embodiment described below with respect to FIG. 11, the controller 1010 for the electro-optic display may be in electrical communication with both a photovoltaic layer 1050 and an energy storage device 1058, as shown in FIG. 10. For example, switches 1056A and 1056B can be activated to allow the controller 1010 to be powered by the photovoltaic layer 1050 and/or the energy storage device 1058. Typically, the controller is configured to provide a time-varying electrical potential between the first and second electrodes on either side of an electro-optic medium. Such time-varying electrical signals are more commonly referred to as "waveforms". Waveforms and controllers for electrophoretic displays are discussed in detail in, for example, U.S. Pat. Nos. 7,012,600 and 9,928,810.

Figure 11:
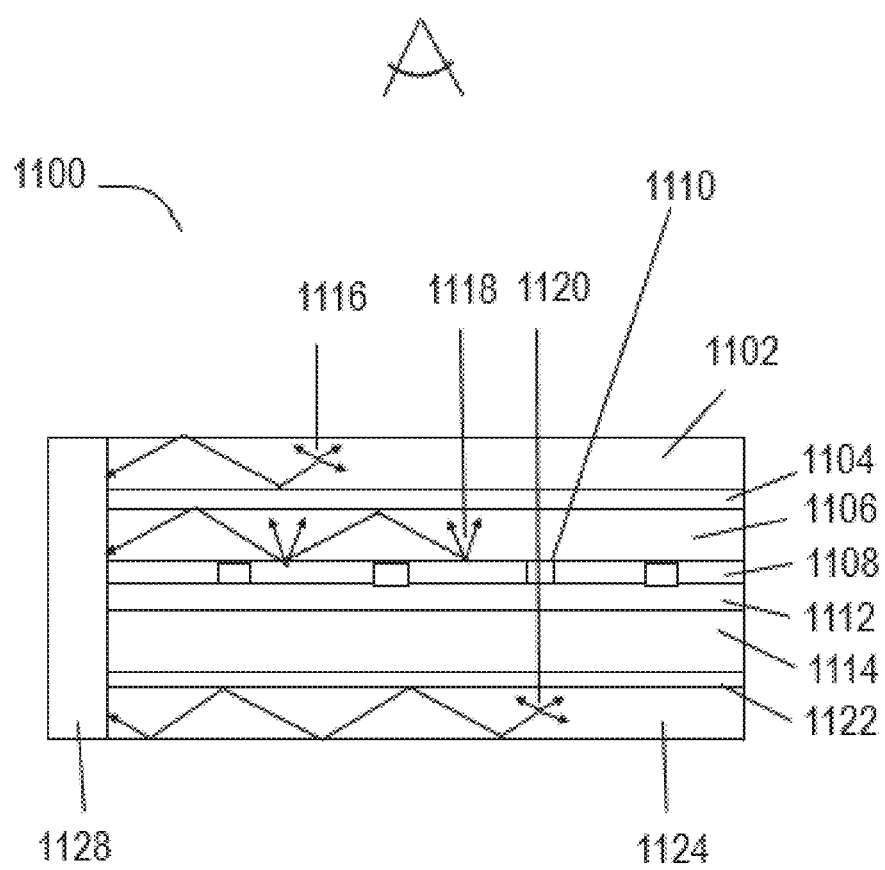
FIG. 11 is a detailed cross-sectional view of another embodiment of an energy harvesting electro-optic display of the present disclosure.

FIG. 11 illustrates another embodiment of an energy harvesting electro-optic display. In this embodiment, an energy harvesting electro-optic display 1100 comprises a first fluorescent light concentrator 1102, comprising a first fluorescent dye. A fluorescent light concentrator is a component of a device that absorbs ultraviolet light and reemits the absorbed light at a longer wavelength. The reemitted light is directed via a LGP by total reflection to a photovoltaic cell 1128, which generates electric current or voltage. The absorption of UV light and reemission of a light of longer wavelength is performed by a fluorescent dye comprised in the fluorescent light concentrator. The first fluorescent light concentrator 1102 overlies an electro-optic material layer 1108, while behind the electro-optic material layer 1108 is a second fluorescent light concentrator 1124, comprising a second fluorescent dye, that captures wavelengths that are transmitted by the electro-optic material layer 1108 (i.e., visible, residual UV and IR). The first fluorescent dye may be the same or different from the second fluorescent dye. A combination of various fluorescent dyes may be used in the first and second fluorescent light concentrators. An optional third light concentrator 1106 captures light scattered by the electro-optic material layer 1108 and directs it via a LGP by total reflection to photovoltaic cell 1128.

The first, second and third concentrators comprise a first, second and third light guide plates respectively. Each light guide plate (LGP) has a pair of opposed faces configured to propagate light along the length of the light guide plate between the faces. The previously described concept of Total Internal Reflection (TIR) is used to achieve this. Photovoltaic cells at one or both the faces of the light guide plates convert the propagated light by the light guide plates to electric current or voltage. These photovoltaic cells may be integrated to one or two photovoltaic cells on each face. The generated electric current or voltage is used for the operation of the electrophoretic display upon the conversion or stored in a storage component to be used for the operation of the electro-optic display at a later time.

Backplane 1114 comprises the rear electrodes and means to address them electrically, such as, for example, an array of thin film transistors. Layer or layers 1112 comprise electrically-conductive adhesives and other layers (for example, sealing layers) that separate backplane 1114 from the electro-optic material layer 1108. The electro-optic material layer 1108 comprises an electro-optic medium. In the specific case of an energy harvesting electrophoretic display, the electro-optic medium is an electrophoretic medium, which is typically compartmentalized, either in capsules or microcells. The compartments are separated by gaps 1110. Such gaps 1110 may be spaces between capsules or light-transmissive beads included in the capsules or the area occupied by the walls of microcells. The gaps may comprise 10% or more of the active surface area of the display.

Overlying the electro-optic material layer 1108 is a combination of layers 1104 that may comprise a second electrically-conductive adhesive layer, a light-transmissive electrode, and an optional polymeric film on which the transparent layer is disposed. Layer 1102, in addition to the first fluorescent light concentrator, may comprise protective layers, such as, for example, water and oxygen barriers and/or ultraviolet absorbers, and other functional layers, such as, for example, touch-sensitive layers, and/or layers designed to improve the optical performance of the display.

As shown in FIG. 11, light rays 1116, 1118, and 1120 represent the three main ways in which light may be lost in the electro-optic display. Ray 1116 represents incident ultraviolet light, i.e. electromagnetic radiation having a wavelength less than about 400 nm. This radiation is typically absorbed by a protective sheet in order to protect the adhesives and the components of the electro-optic material layer of the display. Ray 1118 illustrates visible light that is scattered by the electro-optic material layer 1106 (for example, by the white pigment of an electrophoretic medium). Such scattering is typically Lambertian, such that a significant proportion of incident light is trapped within layer 1106 by total internal reflection. As mentioned above, total internal reflection depends upon the refractive indices of layer 1106 and its adjacent layers. The loss from the scattered light can be in the order of 30% of incident light, when the display is in its white state. This light is piped to the edge of the display and is not returned to the viewer. Of course, when the display is in its dark state most incident visible light is absorbed by black or colored pigments and not appreciably scattered in this way. Ray 1120 shows light that passes through the light-transmissive gaps of the electro-optic material layer. Typically, layer 1112 may be designed to absorb this light, for example by incorporation of wavelength-specific dyes or pigments. This loss can be in the order of 10 to 20% of the incident light on the display.

The energy harvesting electro-optic display 1100 of FIG. 11 comprises two additional layers not typically found in an electro-optic display: 1102 and 1124 (and optionally 1106). Layer 1102 incorporates a first fluorescent material that absorbs ultraviolet light, but not visible light, and reemits it at a longer wavelength. A suitable fluorescent material may include coumarin and coumarin derivatives, such as Alexa Fluoro brand dyes (Thermo-Fisher), as well as Pacific Orange dyes, naphthalene derivatives, and pyrene derivatives. The reemitted light is piped by total internal reflection to a photovoltaic cell 1128 that spans the stack to be converted to electric current or voltage. For example, incident light interacts with the fluorescent material, resulting in visible light fluorescent emission, which is typically isotropic.

Whether or not the reemitted light is confined to layer 1102 depends upon the refractive indices of layer 1102 and 1104, according to Snell's law. Thus, it is preferred to choose a relatively low refractive index for optically clear adhesive layer 1104. For example, layer 1104 may comprise a fluorinated polymer having a refractive index less than about 1.35, while layer 1102 may comprise polymers having refractive indices greater than about 1.5. The photovoltaic cell 1128 may surround the entire edge of layers 1102 or only a portion of that edge. In the latter case, one or more residual edges may include a mirrored surface such that light is reflected back into layer 1102 and eventually is absorbed by photovoltaic cell 1128. Thus, instead of incident ultraviolet light being absorbed and converted to heat, at least some of this radiation is captured and used to power the display, for example, by charging a battery not shown in FIG. 11.

Similarly, part of the visible light incident on a display, represented by ray 1118 in FIG. 11, which is not absorbed by the first fluorescent dye incorporated into layer 1102, may be scattered by the electro-optic material layer 1108 (for example, the white pigment of an electrophoretic medium) at such an angle that the scattered light is trapped by total internal reflection in layer 1106 and directed towards the photovoltaic cell 1128 to be converted to electric current or voltage.

Finally, some of the visible, infra-red, and residual ultraviolet radiation incident on the display passes through the gaps 1110 of the electro-optic material layer 1108. In the present invention, layers 1112, 1114, and 1122 may be designed to be transparent to this radiation, such that the radiation passes through these layers to be eventually absorbed in layer 1124. The second fluorescent light concentrator 1124 comprises a fluorescent dyes that reemits the absorbed light at a longer wavelength, in a similar manner as that described above with reference to layer 1102. In this case, however, the fluorescent dye may not be selective to ultraviolet radiation, but it may rather absorb ultraviolet, visible and near-infrared wavelengths, reemitting at longer infrared wavelengths. Such materials can include, e.g., a mixture of dyes to achieve the desired absorption and emission spectra. Some of this reemitted electromagnetic radiation is then absorbed by photovoltaic cell 1128. In some embodiments, layer 1122 is designed to have a refractive index lower than that of layer 1124, such that light is trapped within layer 1124 by total internal reflection. As described above with respect to layer 1102, the edges of layer 1124 that are not in optical contact with photovoltaic cell 1128 may be provided with a reflective coating or other reflective element, such that light remains trapped within layer 1124. In other embodiments, layer 1124 can simply include a photovoltaic element itself that covers the whole or a part of the area of the display, as described above with respect to FIGS. 1, 2A, and 2B.

In the case of energy harvesting electrophoretic displays, wherein the electrophoretic material layer comprises capsules, the capsules are separated by gaps 1110, which may be spaces between the capsules formed by the inclusion of light-transmissive beads along with the capsules comprising electrophoretic particles in a non-polar electrophoretic liquid. The volume ratio of capsules to light-transmissive beads of the electrophoretic material layer is from about 1:20 to 1:3, from about 10:90 to about 1:1, or from about 1.5:1 to about 3:1. Light-transmissive beads are solid or semi-solid particles, insoluble in the non-polar electrophoretic liquid of the electrophoretic medium. The beads may be spheres, rods, cones, pyramids, cones, or other shapes; they may comprise glass, polymers, or combinations thereof. The average size of the light-transmissive beads (diameter in the case of a sphere or the largest dimension in the case of other shapes) may be from about 10 to about 500 µm, from about 20 to about 100 µm, or from about 20 to about 80 µm. The beads are light-transmissive, which means that a dispersion made from 90 weight percent Isopar G and 10 weight percent beads in a 12.4 mm×12.4 mm quartz cuvette has 90% total light transmittance or higher. The light-transmittance is measured as % total transmittance, which is the ratio of total energy of transmitted light from the layer to the energy of the incident light×100, measured between wavelengths of 400 and 800 nm. The inclusion of light-transmissive beads in the electrophoretic medium of the energy harvesting electrophoretic display 1100, enables the increase of the portion of the incident light that reaches the second fluorescent light concentrator 1124. The lower the volume ratio of capsules to light-transmissive beads, the higher the portion of the incident light that reaches the second fluorescent light concentrator 1124 and the higher the electric current or voltage that is generated by the photovoltaic cell 1128.

In the case of energy harvesting electrophoretic displays wherein the electrophoretic material layer comprising microcells, the microcells are separated by gaps 1110, which are the walls of microcells. The horizontal cross section of the microcells of the electrophoretic material layer may have various shapes, for example, square, round or polygonal, such as a honeycomb structure. The longest dimension of the diameter of each microcell may be from about 40 to about 300 µm, from about 50 to about 180 µm, or from about 60 to about 160 µm. Each microcell comprises electrophoretic medium with electrophoretic particles in a non-polar electrophoretic liquid and a sealing layer, which seals the microcell opening. The walls may have thickness from about 3 to about 120 µm, from about 6 to about 80 µm, or from about 7 to about 40 µm. The wall thickness may occupy from about 5% to about 75%, from about 10% to about 50%, or from about 12% to about 25% of the active surface area of the electrophoretic display component of the energy harvesting electrophoretic display. The walls of the microcells of electrophoretic displays are constructed from a polymeric material comprising pigment or filler particles. These particles increase the opacity of the walls and improve the elector-optic performance. The walls of the inventive energy harvesting electrophoretic display of FIG. 11 (comprising microcells) are made of polymeric material comprising less than 0.2 weight percent pigment or filler particles. This results in an increase in the light-transmittance of the electrophoretic material layer, which leads to a largest portion of the incident light reaching the second fluorescent light concentrator 1124 to generate electric current or voltage. Higher light-transmittance can be achieved by lower weight percent of particles in the polymeric material and by thicker microcell walls. The light-transmittance of the electrophoretic material layer of the energy harvesting electrophoretic display 1100 comprising microcells is from about 5 to about 75%, or from about 10% to about 50%, or from about 12% to about 25%. The light-transmittance of the electrophoretic material layer is measured as % total transmittance, which is the ratio of total energy of transmitted light from the layer to the energy of the incident light×100. The % total light transmittance is measured by standard method ISO 13468 using D65 illuminant and a UV-Visible spectrophotometer.

Thus, the present disclosure provides energy harvesting electro-optic displays that comprise a photovoltaic layer comprising a photovoltaic cell. Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

What is claimed is:

1. An energy harvesting electro-optic display having a viewing side, the energy harvesting electro-optic display comprising in order from the viewing side:
    a first fluorescent light concentrator comprising a first fluorescent dye and a first light guide plate, the first light guide plate having a pair of opposed faces, the first light guide plate being configured to propagate light along the length of the first light guide plate between the pair of opposed faces of the first light guide plate;
    a first photovoltaic cell at one or both the pair of opposed faces of the first light guide plate;
    a first light-transmissive electrode layer;
    an electro-optic material layer comprising light-transmissive gaps;
    a backplane comprising a second electrode layer;
    a second fluorescent light concentrator comprising a second fluorescent dye and a second light guide plate, the second light guide plate having a pair of opposed faces, the second light guide plate being configured to propagate light along the length of the second light guide plate between the pair of opposed faces of the second light guide plate; and
    a second photovoltaic cell at one or both the pair of opposed faces of the second light guide plate;
    wherein the first fluorescent light concentrator absorbs ultraviolet light incident to the viewing side of the energy harvesting electro-optic display, reemits light of longer wavelength, and directs the reemitted light of longer wavelength onto the first photovoltaic cell to be converted into first electric current or first voltage;
    wherein the second fluorescent light concentrator absorbs light incident to the viewing side of the energy harvesting electro-optic display that traverses the electro-optic material layer, reemits the traversed light, and directs the reemitted light of the traversed light onto the second photovoltaic cell to be converted into second electric current or second voltage;
    wherein the generated second electric current or second voltage is used for an operation of the electro-optic display or is stored in a storage component to be used for the operation of the electro-optic display at a later time.

2. The energy harvesting electro-optic display of claim 1, further comprising a first adhesive layer, the first adhesive layer being disposed between the electro-optic material layer and the backplane.

3. The energy harvesting electro-optic display of claim 1, further comprising (a) a third light concentrator comprising a third light guide plate, the third light guide plate having a pair of opposed faces, the third light guide plate being configured to propagate light along the length of the third light guide plate between the pair of opposed faces of the third light guide plate, and (b) a third photovoltaic cell at one or both the pair of opposed faces of the third light guide plate, wherein the third light concentrator is located between the first light concentrator and the electro-optic material layer, and wherein the third light concentrator absorbs light that is reflected by the electro-optic material layer, and directs the absorbed light onto the third photovoltaic cell to be converted into electric current or voltage.

4. The energy harvesting electro-optic display of claim 3, further comprising a second adhesive layer, the second adhesive layer being disposed between the second fluorescent light concentrator and the third light concentrator.

5. The energy harvesting electro-optic display of claim 1, wherein the electro-optic material layer comprises an electrophoretic medium that is compartmentalized in capsules or microcells, wherein the capsules or microcells comprise electrophoretic particles in a non-polar electrophoretic liquid, and wherein the light-transmissive gaps separate the capsules or-microcells.

6. The energy harvesting electro-optic display of claim 5, wherein the electrophoretic medium is compartmentalized in the capsules, wherein the light-transmissive gaps are light-transmissive beads, and wherein a volume ratio of the capsules to the light-transmissive beads in the electrophoretic medium is from about 1:20 to about 1:3.

7. The energy harvesting electro-optic display of claim 6, wherein the light-transmissive beads have diameter of from about 10 to about 500 μm.

8. The energy harvesting electro-optic display of claim 5, wherein the electrophoretic medium comprises the microcells, wherein the light-transmissive gaps are walls of the microcells, and wherein a thickness of the walls of the microcells is from about 3 to about 120 μm.

9. The energy harvesting electro-optic display of claim 8, wherein the walls of the microcells comprise less than 0.2 weight percent of pigment or filler particles.

10. The energy harvesting electro-optic display of claim 1, wherein a percent total transmittance of the electro-optic material layer is from about 5% to about 75%.

11. The energy harvesting electro-optic display of claim 1, wherein the first and second photovoltaic cells are integrated into a singular photovoltaic module.

12. The energy harvesting electro-optic display of claim 3, wherein the first, second, and third photovoltaic cells are integrated into a singular photovoltaic module.

13. The energy harvesting electro-optic display of claim 1, further comprising a protective layer, wherein the first fluorescent light concentrator is disposed in between the protective layer and the electro-optic material layer.

14. The energy harvesting electro-optic display of claims 1, further comprising a battery in electrical communication with the first photovoltaic cell.

\* \* \* \* \*